United States Patent [19]
Miller et al.

[11] Patent Number: 6,107,452
[45] Date of Patent: Aug. 22, 2000

[54] THERMALLY AND/OR PHOTOCHEMICALLY CROSSLINKED ELECTROACTIVE POLYMERS IN THE MANUFACTURE OF OPTO-ELECTRONIC DEVICES

[75] Inventors: Robert Dennis Miller; Gerrit Klaerner, both of San Jose; John Campbell Scott, Los Gatos, all of Calif.

[73] Assignees: International Business Machines Corporation, Armonk, N.Y.; Board of Trustees of the Leland Stanford Junior University, Palo Alto, Calif.

[21] Appl. No.: 09/169,344

[22] Filed: Oct. 9, 1998

[51] Int. Cl.[7] .......................... C08G 63/00; H05B 33/13; H01J 1/62
[52] U.S. Cl. .......................... 528/422; 528/176; 528/271; 528/330; 528/366; 428/411.1; 428/691; 428/457; 313/506; 313/507; 313/509
[58] Field of Search ...................................... 528/330, 366, 528/422, 176, 271; 313/507, 506, 509; 428/457, 691, 917, 411.1

[56] References Cited

U.S. PATENT DOCUMENTS

| | | | |
|---|---|---|---|
| 5,726,282 | 3/1998 | Jenekhe et al. | 528/183 |
| 5,767,624 | 6/1998 | Gordon, II et al. | 313/509 |
| 5,807,974 | 9/1998 | Kim et al. | 528/271 |
| 5,998,045 | 12/1999 | Chen et al. | 428/690 |

FOREIGN PATENT DOCUMENTS 0 712 171 A1  5/1996  European Pat. Off. .

OTHER PUBLICATIONS

Bellman et al. (1998), "New Triarylamine–Containing Polymers as Hole Transport Materials in Organic Light–Emitting Diodes: Effect of Polymer Structure and Cross–Linking on Device Characteristics," *Chem. Mater. 10:*1668, The month in the date of publication is not available.

Brown et al. (1992), "Poly(p–phenylenevinylene) Light–Emmitting Diodes: Enhanced Electroluminescent Efficiency through Charge Carrier Confinement," *Appl. Phys. Lett. 61*(63):2793–2795, The month in the date of publication is not available.

Burroughes et al. (1990), "Light–Emitting Diodes Based on Conjugated Polymers," *Nature* 347 (6293):539–541, The month in the date of publication is not available.

Kreyenschmidt (1998), "Thermally Stable Blue–Light–Emitting Copolymers of Poly(alkyl–fluorene)," *Macromolecules 31*:1099–1103, The month in the date of publication is not available.

Roitman et al. (1998), "Polymer Thermosetting Organic Light–Emitting Devices," *IEEE Journal of Selected Topics in Quantum Electronics 4*(1):58, The month in the publication is not available.

Sheats et al. (1996), "Organic Electroluminescent Devices," *Science 273*:884–888.

*Primary Examiner*—P. Hampton-Hightower
*Attorney, Agent, or Firm*—Dianne E. Reed; J. Elin Hartrum; Reed & Associates

[57] ABSTRACT

Preparation of thermally and/or photochemically crosslinkable oligomeric precursors and the use of those oligomeric precursors in preparing crosslinked electroactive polymers are described. The oligomers, polymers, and synthetic methods find utility in the manufacture of opto-electronic devices such as light emitting diodes, photoconductors, photovoltaic cells, and the like, wherein synthesis of electroactive films and polymeric multilayers is required.

17 Claims, 1 Drawing Sheet

THERMALLY AND/OR PHOTOCHEMICALLY CROSSLINKED ELECTROACTIVE POLYMERS IN THE MANUFACTURE OF OPTO-ELECTRONIC DEVICES

TECHNICAL FIELD

This invention relates generally to electroactive polymers. More particularly, the invention pertains to thermally and/or photochemically crosslinked electroactive polymers, preparation thereof, and use in the manufacture of various types of opto-electronic devices.

BACKGROUND

Electroactive polymers are now frequently used in a number of optical and electronic applications such as in light emitting diodes ("LEDs"), photovoltaic energy converters, photodetectors, photoconductors, e.g., in electrophotography, and in chemical and biochemical sensors. In each of these applications, it may be preferred or necessary to cast multiple layers, i.e., laminates, of different polymers on a single substrate surface, so that one can achieve optimization of separate functions, for example electron or hole charge transport, luminescence, photo-induced charge generation, and charge blocking or storage.

Preparation of polymer laminates is often difficult because the initially cast or deposited layers are soluble in the solvents used for succeeding layers. In some cases, for example with polyphenylenevinylene ("PPV"), there is a suitable soluble polymeric precursor that becomes insoluble upon chemical conversion to the desired electroactive form. However, the chemical conversion process frequently involves extreme processing conditions and reactive by-products that harm the performance of the finished device. Thus, it would be desirable to have a method that permits the formation of insoluble electroactive polymer layers, but does not involve reagents or reaction conditions that would be detrimental to already existing layers.

The present invention is addressed to the aforementioned need in the art, and provides a method for preparing insoluble electroactive polymers from soluble, thermally and/or photochemically crosslinkable oligomeric precursors, without need for harsh reagents or extreme processing conditions. The invention thus represents an important advance in the art, insofar as the preparation of polymer laminates containing one or more electroactive polymer layers may now be carried out using relatively mild reagents and reaction conditions, without introduction of deleterious species or production of undesirable by-products, thus preserving the chemical and physical integrity of the materials used and the device fabricated therefrom.

SUMMARY OF THE INVENTION

It is accordingly a primary object of the invention to provide a novel method for synthesizing an oligomer that may be crosslinked under mild reaction conditions to prepare an insoluble electroactive polymer.

It is another object of the invention to provide such a method wherein the mild reaction conditions comprise heat treatment at a temperature in the range of about 150° C. to 200° C.

It is still another object of the invention to provide novel thermally and/or photochemically crosslinkable oligomers useful for preparing electroactive polymers.

It is yet another object of the invention to provide a method for preparing an electroactive polymer that is insoluble in common aqueous and organic solvents, which involves preparing a suitable thermally crosslinkable oligomer and then heat-treating the oligomer to yield a crosslinked electroactive polymer.

It is an additional object of the invention to provide novel electroactive polymers prepared by the aforementioned processes.

It is a further object of the invention to provide opto-electronic devices containing one or more of the novel electroactive polymers, including LEDs, photoconductors and photovoltaic cells.

It is still a further object of the invention to provide such devices in which multiple layers of polymers are present on a single surface, and at least one of the layers comprises a novel electroactive polymer of the invention.

Additional objects, advantages and novel features of the invention will be set forth in part in the description which follows, and in part will become apparent to those skilled in the art upon examination of the following, or may be learned by practice of the invention.

In one embodiment, then, a thermally or photochemically crosslinkable oligomer is prepared by reacting, under coupling conditions, an initial oligomeric moiety comprised of arylene monomer units (including monomer units containing arylene moieties in combination with other moieties) and bearing halo-substituted termini, with a halobenzene reactant, wherein the initial oligomeric moiety and/or the halobenzene reactant are substituted with a reactive group R containing an unsaturated bond. The reaction gives rise to an oligomer containing arylene or arylene-containing monomer units having reactive R groups that will then enable crosslinking. The monomer units in the oligomer may be identical, or two or more different monomer units may be present. The arylene- or arylene-containing monomer units are arylamines, fluorescent polycyclic aromatic hydrocarbons, electron deficient monomer units, aromatic dyes, azo dyes, or other moieties selected to provide the polymer ultimately prepared from the oligomer with the desired properties. That is, arylamines are typically preferred for preparing polymers that will serve as hole transport layers, while fluorescent species are necessary for preparing emissive polymer layers, and electron deficient monomers that will provide conjugation are required for polymeric electron transport layers.

In another embodiment, the invention pertains to preparation of crosslinked electroactive polymers from the aforementioned oligomers. The process involves preparing an oligomer containing arylene or arylene-containing monomer units, as described above, followed by heat treatment to give the crosslinked electroactive polymer. Generally, the oligomer is dissolved in a suitable solvent, provided as a thin film on a substrate which may or may not already have one or more polymeric layers thereon, and cured, i.e., crosslinked, with heat and/or light.

In a further embodiment, the invention provides opto-electronic devices prepared using the aforementioned oligomers, polymers and methods. Generally, these opto-electronic devices comprise a substrate having a plurality of polymeric layers on the surface thereof, wherein at least one of the polymeric layers is a thermally crosslinked electroactive polymer as provided herein. Preferred opto-electronic devices are LEDs, wherein at least one of the polymeric layers comprises an emissive layer. Other opto-electronic devices are photovoltaic cells, wherein any one of a hole transport layer, a charge generation layer, and an electron transport layer may comprise a crosslinked electroactive polymer as provided herein. Additional opto-electronic devices are photoconductors, such as may be used in a laser printer or in other electrophotographic applications, wherein either or both of a charge generation layer and an overlying charge transport layer may comprise a crosslinked electroactive polymer as provided herein. Still other opto-electronic devices that may comprise the crosslinked electroactive polymers as provided herein, prepared using the present methods, include photodetectors and chemical and biochemical sensors.

DETAILED DESCRIPTION OF THE INVENTION

Overview and Definitions

Figure 1:
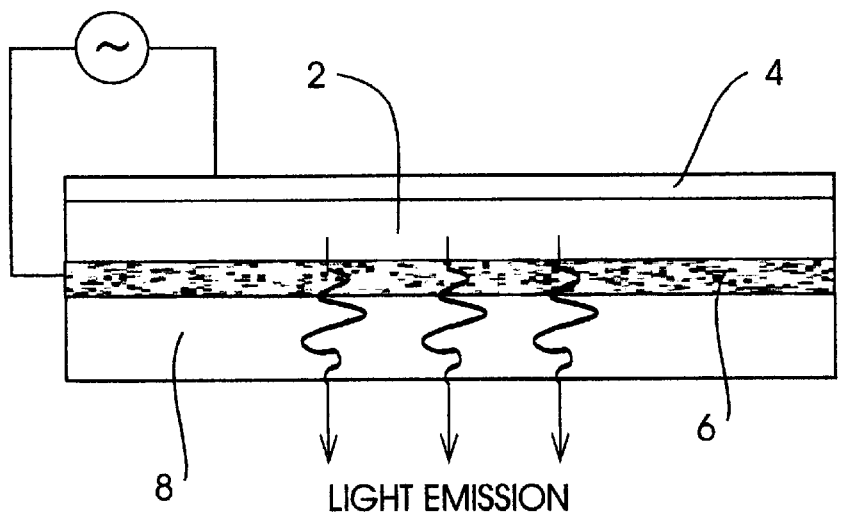
FIG. 1 is a cross-sectional view of an embodiment of a light-emitting device as may be prepared using the oligomers, polymers and methods of the invention.

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, for example, reference to "an arylene" moiety includes mixtures or combinations of such moieties, reference to "a layer" includes multiple layers, reference to "a reagent" includes mixtures of reagents, and the like.

In describing and claiming the present invention, the following terminology will be used in accordance with the definitions set out below.

The term "oligomer" is used herein to indicate a substantially linear chemical compound comprising at most about 50 monomer units, typically less than about 20 monomer units. The term "polymer" is used to refer to a chemical compound that comprises linked monomers as well (and thus encompasses an "oligomer"), but is not necessarily linear—the electroactive polymers prepared herein are in fact crosslinked—and will generally comprise more than about 20 monomer units, preferably more than about 50 monomer units.

The term "electroactive" as used herein refers to a material that is capable of transporting charge (either +or −).

The term "insoluble" as used herein refers to the thermally and/or photochemically crosslinked electroactive polymers of the invention, and indicates that the polymers are completely insoluble or soluble to an insignificant degree in the solvents typically used to prepare opto-electronic devices, particularly polar and nonpolar organic solvents.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms, and the term "lower alkyl ester" refers to an ester functionality —C(O)O—R wherein R is lower alkyl.

The term "alkenyl" as used herein refers to a branched or unbranched hydrocarbon group of 2 to 24 carbon atoms containing at least one double bond, typically containing one to six double bonds, more typically one or two double bonds, e.g., ethenyl, n-propenyl, n-butenyl, octenyl, decenyl, and the like, as well as cycloalkenyl groups such as cyclopentenyl, cyclohexenyl and the like. The term "lower alkenyl" intends an alkenyl group of two to six carbon atoms, preferably two to four carbon atoms.

The term "alkynyl" as used herein refers to a branched or unbranched hydrocarbon group of 2 to 24 carbon atoms containing at least one triple bond, e.g., ethynyl, n-propynyl, n-butynyl, octenyl, decenyl, and the like, as well as cycloalkynyl groups such as cyclooctynyl, cyclononynyl, and the like. The term "lower alkynyl" intends an alkynyl group of two to six carbon atoms, preferably two to four carbon atoms.

The term "alkoxy" as used herein refers to a substituent —O—R wherein R is alkyl as defined above. The term "lower alkoxy" refers to such a group wherein R is lower alkyl.

The term "aryl" as used herein, and unless otherwise specified, refers to an aromatic moiety containing one to seven aromatic rings. For aryl groups containing more than one aromatic ring, the rings may be fused or linked. Aryl groups are optionally substituted with one or more substituents per ring; suitable substituents include, for example, halo, haloalkyl, alkyl, alkenyl, alkynyl, alkoxy, alkoxycarbonyl, carboxy, nitro, cyano and sulfonyl. The term "aryl" is also intended to include heteroaromatic moieties, i.e., aromatic heterocycles. Generally the heteroatoms will be nitrogen, oxygen or sulfur.

The term "arylene" as used herein, and unless otherwise specified, refers to a bifunctional aromatic moiety containing two to seven aromatic rings that are either fused or linked. Arylene groups are optionally substituted with one or more substituents per ring; as above, suitable substituents include halo, haloalkyl, alkyl, alkenyl, alkynyl, alkoxy, alkoxycarbonyl, carboxy, nitro, cyano and sulfonyl.

The term "halo" is used in its conventional sense to refer to a chloro, bromo, fluoro or iodo substituent. In the compounds described and claimed herein, halo substituents are generally bromo, chloro or iodo, preferably bromo or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom. "Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

In a first embodiment of the invention, a method is provided for synthesizing a crosslinkable oligomer that can be beat-treated or photocured to prepare an electroactive polymer that is insoluble in common aqueous and organic (polar and nonpolar) solvents. The method for making the crosslinkable oligomer involves reacting, under coupling conditions, an initial oligomeric moiety comprised of arylene monomer units and bearing halo-substituted termini with a halobenzene reactant, wherein the initial oligomeric moiety and/or the halobenzene reactant are substituted with a reactive group R containing an unsaturated bond, under coupling conditions. The reaction is preferably conducted in the presence of a catalyst, e.g., a nickel catalyst such as bis(1,5-cyclooctadiene)nickel.

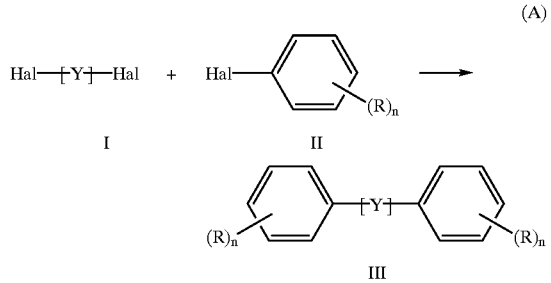

(A)

In reaction scheme (A), "Hal" represents a halogen atom, preferably bromo or chloro, n is 0 to 4, preferably 1 or 2, and —[Y]— comprises j monomer units —[X]— and q monomer units —[X(R)]—, wherein X represents a polycyclic arylene or arylene-containing moiety and j and q are integers, the sum of which is typically in the range of 1 to 50 inclusive, preferably in the range of 1 to 20 inclusive.

The reactive moiety R, which enables the intermediate (III) to crosslink under appropriate conditions, is present either on the initial oligomeric moiety (I) (i.e., when —[X(R)]— monomer units are present), the halobenzene reactant (II) (when n is nonzero), or both. Thus, scheme (A) encompasses the following reactions (B), (C), (D) and (E).

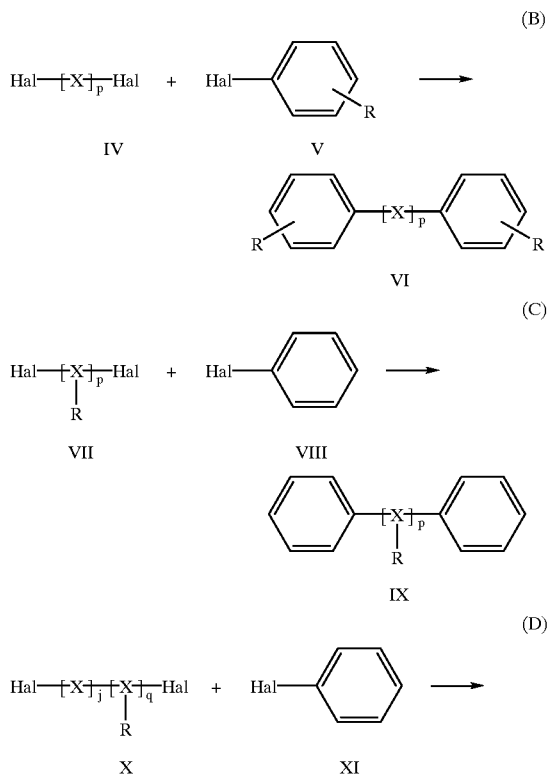

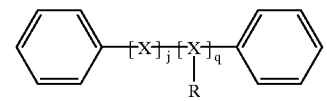

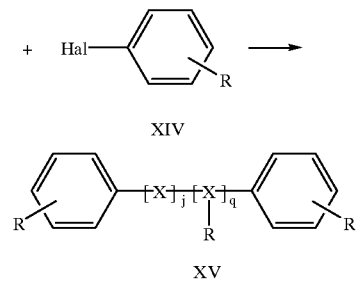

The subscript p is an integer in the range of 1 to 50, and X comprises two to seven aromatic rings, which may be fused to each other and/or linked, if linked, either directly, or through a linking group, e.g., an alkylene linkage or an —NH— linkage optionally substituted with an aromatic moiety, an alkyl group, a haloalkyl group, or the like, and are optionally substituted with one or more substituents per ring, e.g., halo, haloalkyl, alkyl, alkenyl, alkynyl, alkoxy and nitro. X may be heterocyclic or nonheterocyclic, or X can contain a combination of nonheterocyclic aromatic moieties and heterocyclic aromatic moieties, again, either fused or linked.

X is generally selected to correspond to the use of the ultimately prepared electroactive polymer. For example, when the electroactive polymer is to be used as a hole transport layer in an LED, a photoconductor or the like, the monomer units X are preferably arylamines, e.g., triphenylamine, diphenyltolylamine, tetraphenyl-p-phenylene diamine, tetraphenylbenzadine, an arylamine containing polynuclear aromatic and/or heteroaromatic substituents, or a diarylamine such as an N-substituted carbazole or an aminobenzaldehyde hydrazone. For electron transport layers in LEDs, photoconductors or the like, the X moieties generally represent electron deficient monomer units that provide conjugation upon polymerization, and include heterocyclic and/or nonheterocyclic aromatic groups, e.g., aryl sulfones (such as biphenyl sulfone), aryl sulfoxides, fluorinated aryls (such as bis (diphenylhexafluoropropane) and octafluorobiphenyl), biphenyls, diaryl phosphine oxides, benzophenones, 1,2,3-triazole, 1,2,4-triazole, 1,2,3-oxadiazole, 1,2,4-oxadiazole (azoxime), 1,2,5-oxadiazole(furazan), 1,3,4-oxadiazole, 1,4-oxazine, 1,2,5-oxathiazine, benzothiophene, 2,5-diaryl oxadiazoles, thiophene, benzothiophene, pyridines, quinolines(including quinoline and isoquinoline), quinoxalines, and pyrimidines. In a charge generation layer in a photocell, it is generally desirable to choose different types of X moieties so that a copolymer is ultimately provided that combines the characteristics of an electron transport layer and a hole transport layer. For an emissive layer, X should be fluorescent, e.g., naphthalene, anthracene, phenanthrene, indene, pyrene, perylene, phenalene, coronene, fluorene, dihexylfluorene, fluorescein, or the like. Exemplary monomers (represented as "X" in the above scheme) for forming an emissive layer, e.g., in an LED, are disclosed in co-pending, commonly assigned U.S. patent application Ser. No. 08/888,172, filed Aug. 27, 1997, entitled "Polymeric Light-Emitting Device." Those monomers include: fluorene optionally substituted with one or more substituents such as phenyl, benzyl, phenoxy, benzyloxy, lower alkyl or lower alkoxy, preferably at the 9-position, e.g., 9,9-dialkylfluorene and 9,9-diphenylfluorene; and anthracene optionally substituted with one or more of the aforementioned substituents, e.g., 9,10-, 2,6-, 1,8- or 1,4-dihaloanthracene or dihalodiphenylanthracenes. Aromatic dyes, e.g., coumarins, rhodamines, pyrans, or the like may also serve as "X" units, for example, to prepare polymer compositions that can be used as photoconductive sensitizers or luminescent emitters. X may also represent an azo dye, when the electroactive polymer is used as a charge generation layer in a photoconductor.

R is a reactive group comprising a thermally or photochemically polymerizable functionality. Typically, R contains an unsaturated bond, either a double bond or a triple bond, preferably a terminal double bond, most preferably a terminal carbon-carbon double bond, and may be, for example, —CH=CH$_2$, —C≡CH, —O(CO)—CH=CH$_2$, —O(CO)—C(CH$_3$)=CH$_2$ and other —O(CO)—C(alkyl)=CH$_2$, particularly —O(CO)—C(lower alkyl)=CH$_2$, —O(CO)—C(C$_6$H$_5$)=CH$_2$, —(CH$_2$)$_m$—O(CO)—CH=CH$_2$, —(CH$_2$)$_m$—O(CO)—C(CH$_3$)=CH$_2$ and other —(CH$_2$)$_m$—O(CO)—C(alkyl)=CH$_2$, particularly —(CH$_2$)$_m$—O(CO)—C(lower alkyl)=CH$_2$, —(CO)—O—O—CH=CH$_2$, —C(CH$_3$)=CH$_2$, —C(CF$_3$)=CH$_2$, —C(CH$_2$CH$_3$)=CH$_2$, —C(CH$_2$CF$_3$)=CH$_2$, —C(C$_6$H$_5$)=CH$_2$, —C=CH(C$_6$H$_5$), —C≡C(C$_6$H$_5$), —(CH$_2$)$_m$—CH=CH$_2$, —(CH$_2$)$_m$—O—CH=CH$_2$, —(CH$_2$)$_m$—(CO)—)—CH=CH$_2$, —(CH$_2$)$_m$—C(CH$_3$)=CH$_2$, —(CH$_2$)$_m$—C(CF$_3$)=CH$_2$, —(CH$_2$)$_m$—C(CH$_2$CH$_3$)=CH$_2$, —(CH$_2$)$_m$—C(CH$_2$CF$_3$)=CH$_2$, —(CH$_2$)$_m$—C(C$_6$H$_5$)=CH$_2$,

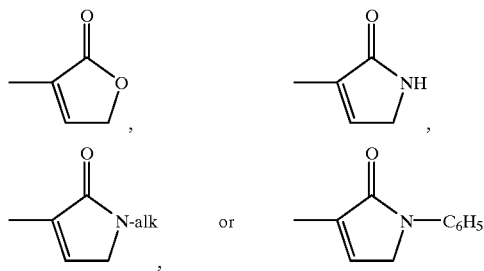

where m is an integer in the range of 1 to 12, typically 1 to 6, and "alk" is alkyl, preferably lower alkyl. Particularly preferred R groups are —CH=CH$_2$, —O(CO)—CH=CH$_2$, i.e., vinyl and acrylate. Other suitable R groups will be known to those skilled in the art and/or described in the pertinent texts and literature as moieties that enable a monomeric or oligomeric species to undergo thermal and/or photochemical crosslinking, preferably by vinyl polymerization.

The reaction to prepare crosslinkable oligomer (III) is conducted in a suitable solvent under an inert atmosphere, such as under argon, at an elevated temperature, preferably at least 50° C., more preferably at least 75° C. Ideally, the reaction is carried out in the absence of light for at least twelve hours, and preferably for twenty-four hours or more. And, as noted above, the use of a catalyst is typically required. Chain termination and hence the molecular weight of the oligomeric product is controlled by (i) addition, at the appropriate time, of an end-capping moiety, e.g., a halogenated styrene such as 2-, 3- or 4-bromostyrene, 1,4-, 3,4- or 3,5-dibromostyrene, bromodivinylbenzene, 2-, 3- or 4-chlorostyrene, etc., and/or (ii) the molar ratio of end-capping reagent to the halobenzene reactant (II). For further detail concerning reagents and reaction conditions that can be used to prepare the crosslinkable oligomer, reference may be had to Yamamoto et al. (1992) *Macromolecules* 25:1214.

The resultant oligomer is soluble in many common solvents, and can be processed to prepare coatings using the reagents and procedures normally used in the fabrication of opto-electronic devices.

The invention also encompasses the crosslinkable oligomers represented as structure (III), above, as novel chemical compounds.

In a further embodiment, the invention is directed to a method for preparing a thermally or photochemically crosslinked electroactive polymer. As explained elsewhere herein, an important application of the invention is in the preparation of polymer multilayers on a substrate, wherein at least one of the layers is electroactive, without using harsh reagents or extreme processing conditions. Using the methods and compositions of this invention, electroactive polymer layers may be prepared without inadvertently dissolving, degrading or otherwise modifying materials and layers that may already be present on the substrate surface.

The method for preparing the electroactive polymer involves, first, synthesizing the crosslinkable oligomer (III) as described above. A solution of the oligomer is prepared in a suitable organic solvent, e.g., p-xylene, toluene, cyclohexanone, anisole, mesitylene, 1,3-dimethoxybenzene, trichloroethylene, or mixtures thereof, at a concentration typically less than about 10 wt. %, preferably less than about 5 wt. %. The oligomer solution is then provided as a film on a substrate, e.g., glass, glass coated with indium tin oxide ("ITO"), or the like, which may or may not have existing polymeric layers on its surface. The film is prepared by spin casting or by any other effective means. The thickness of the film will generally be in the range of about 10 nm to 20 $\mu$m, preferably about 20 nm to 5 $\mu$m; for LEDs, as will be appreciated by those skilled in the art, the maximum film thickness will be on the order of 2 $\mu$m. The film is then cured with heat and/or light, preferably with heat. In either case, curing is preferably carried out under an inert atmosphere such as dry nitrogen, or under vacuum. The curing time and temperature will vary, of course, with the particular oligomer. Curing may be very rapid, occurring within minutes, but will generally be at least about ½ hour, and, for thermal crosslinking, curing temperature will generally be in the range of about 150° C. to 250° C. For photocuring, curing temperatures may be lower, but should be above the glass transition temperature $T_g$ of the precursor material. Photochemical curing is facilitated by the use of a photochemical free radical generator usually present as 1–5 wt. % of the mixture; the mixture may also include a photosensitizer, i.e., a compound that increases the rate of photoinitiated polymerization. Suitable free radical generators and photosensitizers will be known to those skilled in the art and are, in any case, described in the pertinent texts and literature. Examples of free radical generators include, but are not limited to, aromatic ketones such as benzophenone and acetophenone, benzoin and related compounds such as benzoin ethers, benzil and benzil ketals, organometallic derivatives of transition metals (e.g., ferrocene), and peroxides, disulfides and azo compounds.

These relatively mild conditions preserve the electrical and/or optical properties of the polymer, introduce virtually no deleterious species, and produce substantially no undesirable by-products. Subsequent layers can be cast in the same way.

The devices that may be fabricated using the present oligomers, polymers and synthetic methods include LEDs, photovoltaic cells, photoconductors, photodetectors, and chemical and biochemical sensors. A primary application of the present invention is in the fabrication of LEDs, semiconductor devices that convert electrical energy into electromagnetic radiation and are in common usage as illumination sources, in displays and in indicator lamps.

FIG. 1 illustrates an LED prepared using the composition and method of the invention. A charge transporting and emissive layer 2 comprises a crosslinked electroactive polymer of the invention and is sandwiched between and contiguous with opaque electrode 4 and transparent electrode 6. In an alternatively embodiment (not shown), a plurality of such layers may be present at 2. The device is supported on a glass base 8. When a voltage is applied to electrodes 4 and 6, electrons and holes are injected from opposite electrodes, and light is emitted from layer 2 which then radiates from the device through transparent electrode 6 and glass base 8. The electrodes 4 and 6 comprise a conductive material. Suitable opaque electrodes can comprise gold, aluminum, copper, silver or alloys thereof. Suitable transparent electrodes comprise, for example, indium tin oxide, polyaniline or polythiophene. The emissive layer can be prepared using the method of the invention when X is, for example, a fluorescent moiety such as fluorene, anthracene or the like. It may also be desirable to include a hole transport layer (not shown) between the emissive layer 2 and transparent electrode 6 which may also be prepared using the method of the invention. The thermally crosslinkable oligomers used to prepare the hole transport layer, however, will typically contain arylamine "X" units as indicated earlier herein.

Such a device is conveniently fabricated by dissolving the selected thermally crosslinkable oligomer in a suitable solvent, e.g., p-xylene, toluene, or the like, casting a film of the oligomer solution on one of the electrodes, and thermally curing the film. Subsequent layers can be provided in a similar manner, if desired. In the final fabrication step, the second electrode is formed or positioned on the exposed thermally cured surface.

Figure 2:
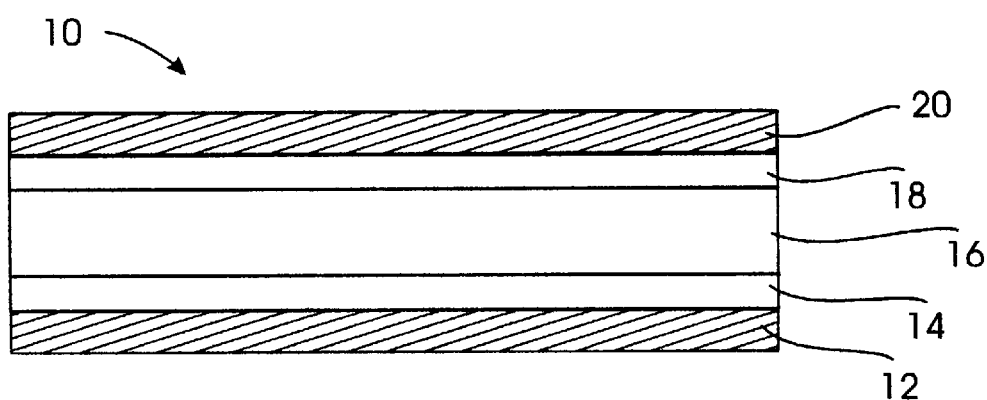
FIG. 2 is a cross-sectional view of a photovoltaic cell as may be prepared using the oligomers, polymers and methods of the invention.

FIG. 2 illustrates a photovoltaic cell 10, for use in solar energy applications. The cell is provided with a hole collector layer 12, a hole transport layer 14, a charge generation layer 16, an electron transport layer 18, and, uppermost, an electron collector 20. The processes of the invention may be used to prepare the hole transport layer 14, the charge generation layer 16, and/or the electron transport layer 18. That is, the electron transport layer 18 can be prepared using the present process with the thermally or photochemically crosslinkable oligomer containing a conjugated heterocyclic moiety, a conjugated aromatic moiety, or a combination thereof (i.e., as "X"; suitable monomers include aryl sulfones, arylsulfoxides, etc., as discussed earlier herein). The charge generation layer 16 will generally be such that a blend of oligomers—or a "co-oligomer"—is used to prepare an electroactive polymer layer that serves as both an electron transport layer and a hole transport layer, i.e., some of the "X" units will be arylamines or the like, and other "X" units will provide conjugation. The hole collector layer will generally comprise gold, nickel, polyaniline, ITO, PEDT, or the like, while the electron collector will typically comprise Ca, Mg, Al:Li, TiN, TiC, etc.

Figure 3:
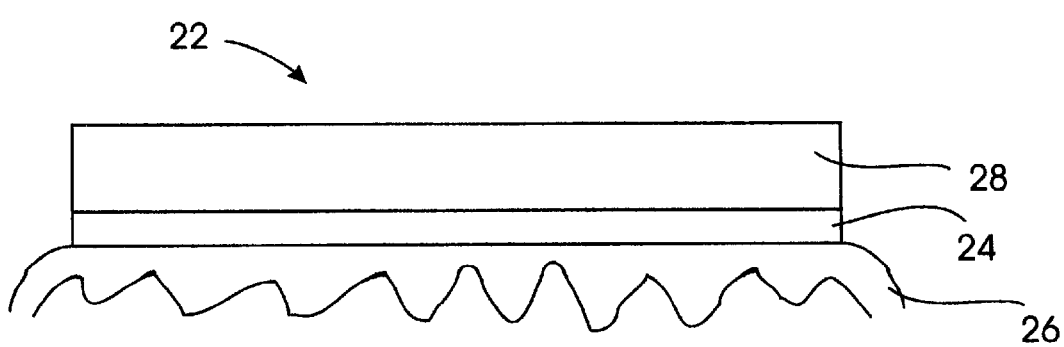
FIG. 3 is a cross-sectional view of a photoconductor as may be prepared using the oligomers, polymers and methods of the invention.

In a photoconductor 22, such as may be used in a laser printer or the like, a charge generation layer 24 is present on a grounded substrate 26, overlaid by a charge transport layer 28, as shown in FIG. 3. In this case, the process of the invention may be used to prepare the charge generation layer 24 with the crosslinkable oligomer containing an azo dye type moiety as "X." Suitable azo dyes for this purpose will be known to those skilled in the art and are in any case described at length in the pertinent literature and texts.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experimental

The following examples are put forth so as to provide those of ordinary skill in the art with a complete disclosure and description of how to prepare and use the oligomers and polymers disclosed and claimed herein. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

Examples 1 through 3 are directed to the preparation of three different thermally crosslinkable oligomers of the invention, while Examples 4 and 5 describe fabrication and evaluation of LEDs prepared using the oligomers prepared in Examples 1 and 2.

EXAMPLE 1

Preparation of oligo-9,9-di-n-hexylfluorene-2,7-diyl

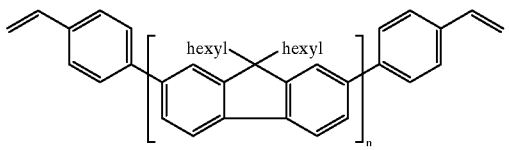

A Schlenk tube containing 700 mg (0.00254 mol) bis(1,5-cyclooctadiene)nickel(0), 450 mg (0.0029 mol) 2,2'-bipyridyl and 0.2 mL 1,5-cyclooctadiene, 6 mL of dry DMF and 6 mL of dry toluene was heated under argon to 80° C. for 0.5 h. 554 mg (0.001125 mol) of 2,7-dibromo-9,9-di-n-hexylfluorene and 71 mg (0.0003875 mol) 4-bromostyrene dissolved in 6 mL of degassed toluene were added under argon to the dark blue reaction mixture. Upon adding the monomers, the color turned to reddish brown and viscosity increased. After maintaining the polymerization mixture for one day in the dark, the hot polymer solution was precipitated in a solution of 100 mL conc. HCl, 100 mL methanol and 100 mL of acetone. After isolating the crude product via filtration, the oligomers were reprecipitated from a chloroform solution into a mixture of acetone/methanol for further purification. $M_n$ (Daltons)=5,000.

EXAMPLE 2
Preparation of oligo-4"-methyl-triphenylamine-4,4'-diyl

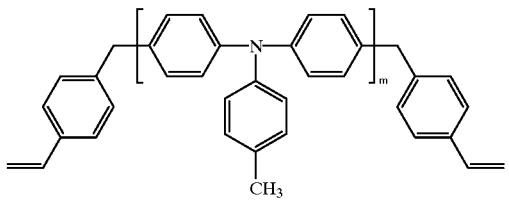

A Schlenk tube containing 700 mg (0.00254 mol) bis(1, 5-cyclooctadiene)nickel(0), 450 mg (0.0029 mol) 2,2'-bipyridyl and 0.2 mL 1,5-cyclooctadiene, 6 mL of dry DMF and 6 mL of dry toluene was heated under argon to 80° C. for 0.5 h. 417 mg (0.001 mol) of 4,4'-dibromo-4"-methyltriphenylamine and 91 mg (0.0005 mol) 4-bromostyrene dissolved in 6 mL of degassed toluene were added under argon to the dark blue reaction mixture. Upon adding the monomers, the color turned to reddish brown and the viscosity increased. After maintaining the polymerization mixture for 1 day in the dark, the hot polymer solution was precipitated in a solution of 100 mL conc. HCl, 100 mL methanol and 100 mL of acetone. After isolating the crude product via filtration the oligomers were reprecipitated from a chloroform solution into a mixture of acetone/methanol for further purification. $M_n$ (Daltons)=3,000.

EXAMPLE 3
Preparation of oligo-2,5-diphenyl-1,3,4-oxadiazole-4',4"-diyl-co-1-phenyl-2,2,2-trifluoromethane-4',4"-diyl-1,1-diphenyl-4', 4"-diyl

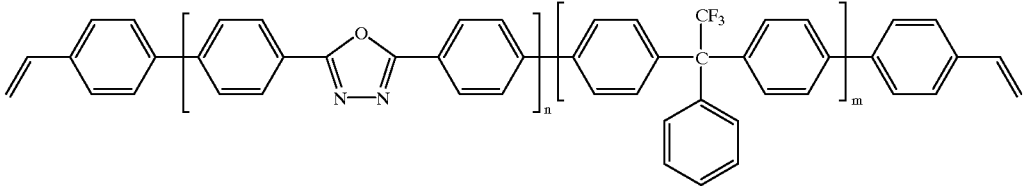

A Schlenk tube containing 700 mg (0.00254 mol) bis(1, 5-cyclooctadiene)nickel(0), 450 mg (0.0029 mol) 2,2'-bipyridyl and 0.2 mL 1,5-cyclooctadiene, 6 mL of dry DMF and 6 mL of dry toluene was heated under argon to 80° C. for 0.5 h. 190 mg (0.0005 mol) of 2,5-bis(4'-bromophenyl)-1,3,4-oxadiazole, 235 mg (0.0005 mol) 1,1-bis(4-bromophenyl)-1-phenyl-2,2,2-trifluoromethane and 91 mg (0.0005 mol) 4-bromostyrene dissolved in 6 mL of degassed toluene were added under argon to the dark blue reaction mixture. Upon adding the monomers, the color turned to reddish brown and the viscosity increased. After maintaining the reaction mixture for 1 day in the dark, the hot polymer solution was precipitated in a solution of 100 mL conc. HCl, 100 nmL methanol and 100 mL of acetone. After isolating the crude product via filtration the oligomers were reprecipitated from a chloroform solution into a mixture of acetone/methanol for further purification. $M_n$(Daltons)=2,500.

EXAMPLE 4
(a) Fabrication of Light-Emitting Devices

Glass substrates were prepared with a patterned ITO anode and cleaned using deionized water and isopropanol reflux. A p-xylene solution (3% by weight) of triphenylamine oligomer (prepared in Example 2) was sonicated for 5 minutes and filtered before spin casting a film at 1500 rpm. The film was cured under vacuum at 200° C. for 16 hours to create an insoluble hole transport layer 30 nm in thickness. Next, on top of the transport layer, a film of fluorene oligomer (prepared in Example 1) was spin coated using a 3 wt. % solution in p-xylene. This layer was cured under vacuum at 200° C. for 5 hours to form the electron transport and emission layer of the device. The thickness of this layer was 65 nm. Patterned cathodes were deposited by vacuum evaporation of 250 Å aluminum. In order to explore the role of the thermally cured hole transport layer, a second set of devices was prepared omitting that layer, i.e. having only the emissive crosslinked fluorene layer.

(b) Evaluation

The electrical and optical performance of the devices was characterized using a dc voltage source, an ammeter and an integrating sphere with a calibrated photodetector. The bilayer devices (triphenylamine hole transport layer and fluorene emissive layer) were found to emit blue light with an external quantum efficiency of 0.06%, and a radiance of 65 $\mu W/cm^2$ (approximately 60 $cd/m^2$) at 14.5 volts. By contrast, the single layer devices had an efficiency less than 0.0001%, and could not sustain a voltage above 7.5 volts.

EXAMPLE 5
(a) Fabrication of Triple-Layer Light Emitting Devices

Patterned ITO substrates were prepared as in part (a) of Example 4. Crosslinkable triphenylamine oligomer (prepared in Example 2) was spin-coated at 1500 rpm from cyclohexanone solution (30 mg/mL) and cured at 200° C. for 4 h under nitrogen atmosphere to form a hole transport layer (HTL) approximately 60 nm thick. Next, the emissive layer was prepared from a crosslinkable copolymer of 85% (molar) di-9,9-n-hexylfluorene and 15% anthracene end-capped with bromo-styrene in a manner analogous to that described in Example 1. A solution of the oligomer in cyclohexanone (30 mg/mL) was then spin-coated at 1500 rpm on to top of the HTL. Again, thermal curing was achieved after heating at 200° C. for 4 h. The layer thickness was approximately 60 nm. Finally, a layer of electron transport material, 1,3,5-tris(4-t-butylphenyl-1,3,4-oxadiazole-phenylene)benzene, was spin-coated from cyclohexanone (30 mg/mL, 1500 rpm) to give a thickness of approximately 70 nm. The substrate was placed into a deposition chamber which was pumped overnight to a pressure of $10^{-6}$ Torr to ensure complete removal of solvent. The cathode was deposited as described in part (a) of Example 4.

(b) Evaluation

The devices were characterized using the same methods described in part (b) of Example 4. The electroluminescence spectrum of this triple-layered LED showed a single narrow blue emission peak at 450 nm with a half width having a height of 55 nm, giving CIE color coordinates of (0.15, 0.11). Only 8 V were required to achieve a radiance of 65

µW/cm² (equivalent, in this case, to 22 cd/m², because of the deeper blue emission spectrum). The external quantum efficiency reached a maximum of 2.0% at 8 V, corresponding to an external power efficiency of 0.58 lm/W. At 15 V, the luminance was 400 cd/m².

What is claimed is:

1. An opto-electronic device comprising a substrate having a plurality of polymeric layers on the surface thereof, wherein at least one of the polymeric layers comprises a crosslinked electroactive polymer prepared by the process comprising:
   (a) reacting, under coupling conditions, (i) an initial oligomeric moiety comprised of arylene monomer units and bearing halo-substituted termini with (ii) a halobenzene reactant, wherein either the initial oligomeric moiety or the halobenzene reactant, or both the initial oligomeric moiety and the halobenzene reactant are substituted with a reactive group R containing an unsaturated bond, to produce a crosslinkable oligomer, and (b) crosslinking the crosslinkable oligomer under conditions sufficient to promote crosslinking.

2. The opto-electronic device of claim 1, comprising a light-emitting diode.

3. The opto-electronic device of claim 1, comprising a photovoltaic cell or detector.

4. The opto-electronic device of claim 1, comprising a photoconductor.

5. The opto-electronic device of claim 1, wherein the step (a) is carried out in the presence of a catalyst.

6. The opto-electronic device of claim 5, wherein the catalyst is a nickel catalyst.

7. The opto-electronic device of claim 6, wherein the catalyst is bis(1,5-cyclooctadiene)nickel.

8. The opto-electronic device of claim 5, wherein the initial oligomeric moiety has the structure

wherein Hal represents a halogen atom, —[Y]— comprises j monomer units —[X]— and q monomer units —[X(R)]— in which X comprises an arylene moiety, j and q are independently integers in the range of 0 to 50, and the sum of j and q is in the range of 1 to 50.

9. The opto-electronic device of claim 8, wherein X comprises a fluorescent moiety.

10. The opto-electronic device of claim 8, wherein X comprises an electron deficient moiety.

11. The opto-electronic device of claim 8, wherein X comprises an arylamine.

12. The opto-electronic device of claim 8, wherein X comprises an azo dye.

13. The opto-electronic device of claim 8, wherein the initial oligomeric moiety has the structure

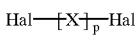

and the halobenzene reactant has the structure

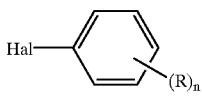

wherein p is an integer in the range of 1 to 50, and n is 1, 2, 3 or 4.

14. The opto-electronic device of claim 13, wherein Hal is bromo or chloro and n is 1.

15. The opto-electronic device of claim 14, wherein R is selected from the group consisting of ethenyl, ethynl, phenylethenyl, phenylethynyl, lower alkyl-substituted ethenyl, lower alkyl-substituted ethynyl, acrylate,

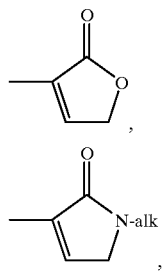, 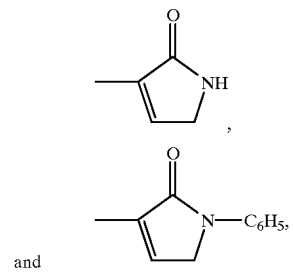

and wherein alk represents a lower alkyl substituent.

16. The opto-electronic device of claim 5, wherein step (c) is carried out by heating the oligomer.

17. The opto-electronic device of claim 5, wherein step (c) is carried out photochemically.

* * * * *